United States Patent [19]

Foulke et al.

[11] Patent Number: 4,493,606

[45] Date of Patent: Jan. 15, 1985

[54] WAFER TRANSFER APPARATUS

[75] Inventors: Richard F. Foulke, Carlisle; Steven M. Lord, Malden, both of Mass.

[73] Assignee: Proconics International, Inc., Woburn, Mass.

[21] Appl. No.: 381,292

[22] Filed: May 24, 1982

[51] Int. Cl.³ .................................................. B65G 17/32
[52] U.S. Cl. .................................. 414/787; 294/64 R; 414/404; 414/416; 414/730; 414/732; 414/737
[58] Field of Search ................ 414/275, 331, 403–416, 414/730, 732, 737, 752, 787; 318/640; 294/64 R; 901/45, 47

[56] References Cited

U.S. PATENT DOCUMENTS

| | | | |
|---|---|---|---|
| 3,054,036 | 9/1962 | Lenk et al. ........................ | 318/162 |
| 3,272,350 | 9/1966 | Pflaumer et al. .................. | 214/1 |
| 3,280,950 | 10/1966 | Magloire ......................... | 192/143 |
| 3,603,691 | 9/1971 | Hamilton ......................... | 356/152 |
| 3,719,879 | 3/1973 | Marcy ............................ | 318/593 |
| 3,888,362 | 6/1975 | Fletcher et al. ................. | 414/730 X |
| 3,902,615 | 9/1975 | Levy et al. ..................... | 214/301 |
| 3,902,713 | 9/1975 | Von Luhmann et al. ............. | 271/154 |
| 3,921,788 | 11/1975 | Roberson, Jr. et al. ........... | 198/19 |
| 4,178,113 | 12/1979 | Beaver et al. .................. | 406/10 |
| 4,208,159 | 6/1980 | Uehara et al. .................. | 414/225 |
| 4,222,166 | 9/1980 | Kurek et al. ................... | 29/831 |

OTHER PUBLICATIONS

Semiconductor Production, Autumn 1980, New Automatic Wafer Handling Equipment for Semi Standard Plastic Carriers, Guy Mongodin.

*Primary Examiner*—Robert G. Sheridan

[57] ABSTRACT

Apparatus for placing a first element at a receptacle location on a second element, there being associated with the precise receptacle location some known variation in the shape of the second element, the apparatus comprising a support member for supporting the first element while the member is translated toward the second element along a placement direction, a first transport device for moving the support member or the second element along a direction transverse to the placement direction, and a sensing device located on the support member for sensing the relative alignment along the transverse direction of the support member and the variation in shape, the sensing device comprising an energy-beam source adapted and positioned to direct an energy beam along a path that interacts with the variation in shape at least when the support member and receptacle location are aligned so that more of the beam is transmitted along the path when the member and receptacle location are aligned than when the member and receptacle are not aligned and an energy beam sensor adapted and positioned to detect the difference in the amount of the beam transmitted along the path.

32 Claims, 17 Drawing Figures

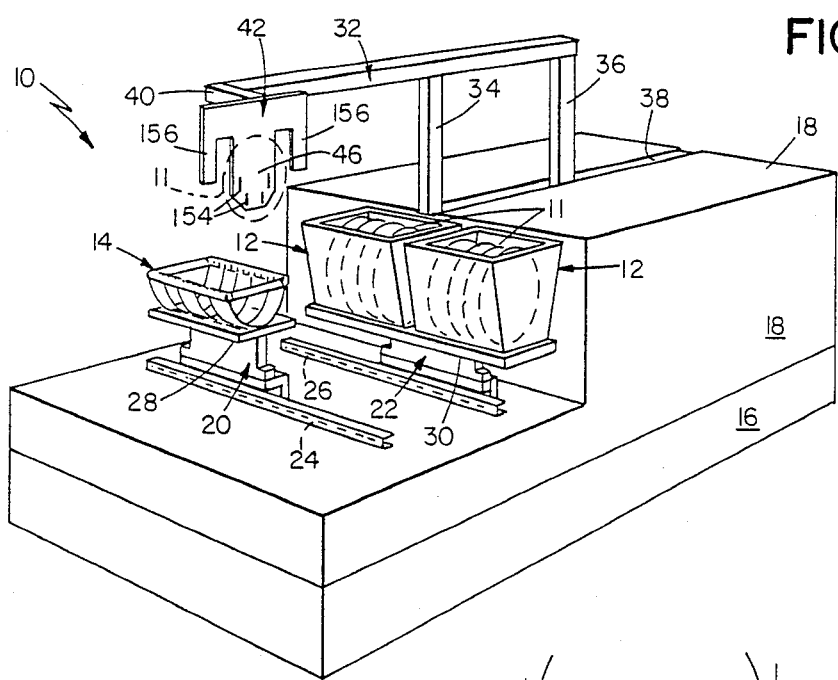
FIG 1
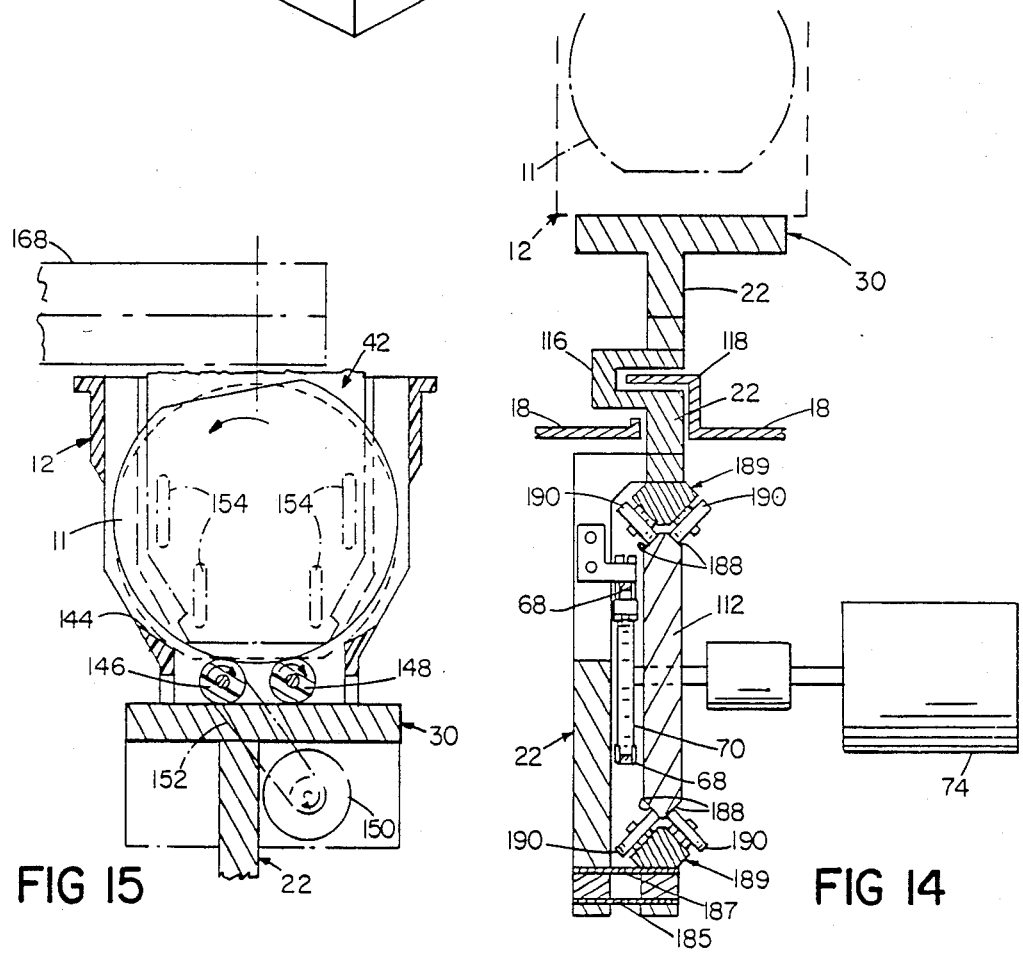
FIG 15
FIG 14

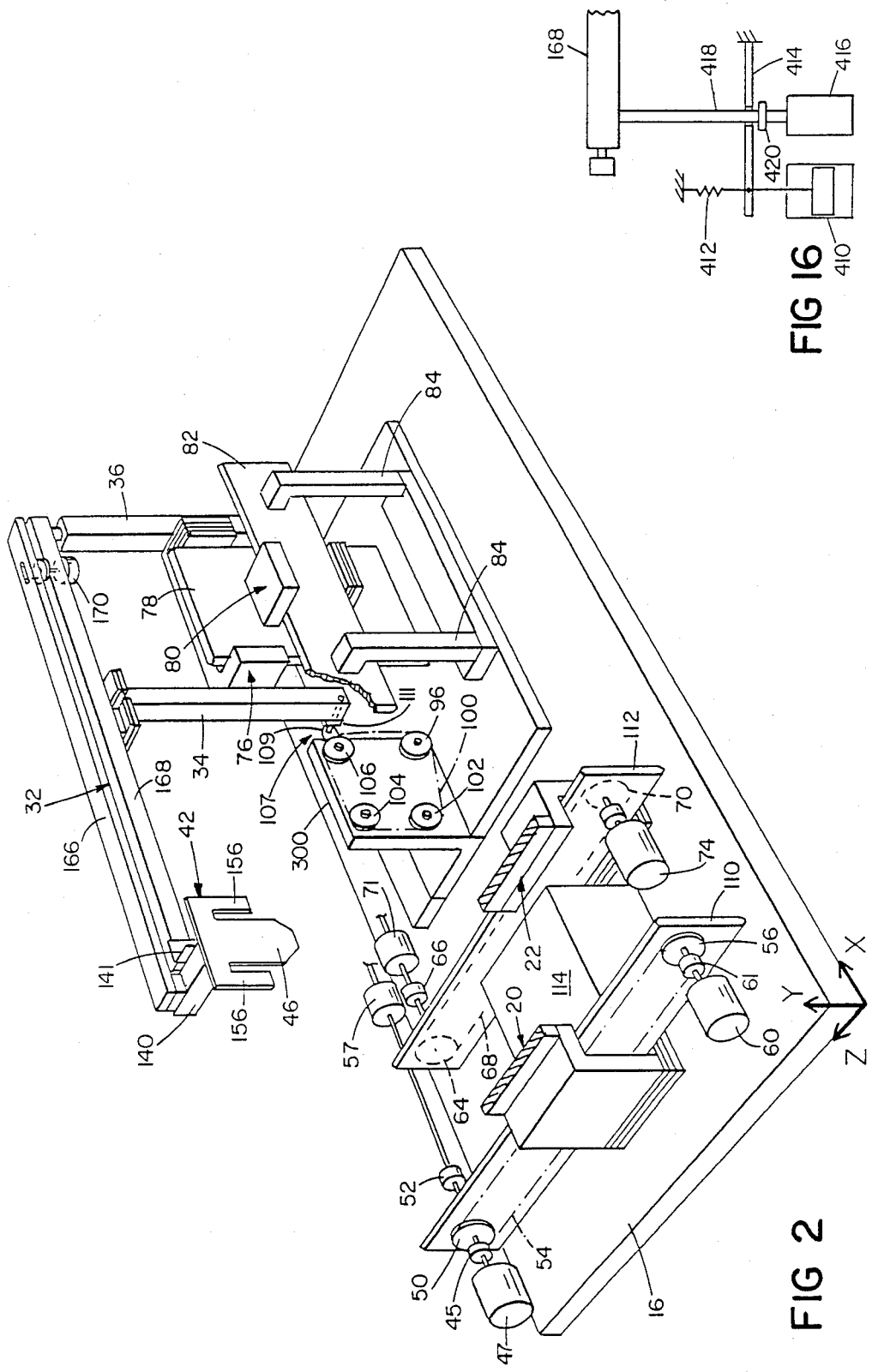

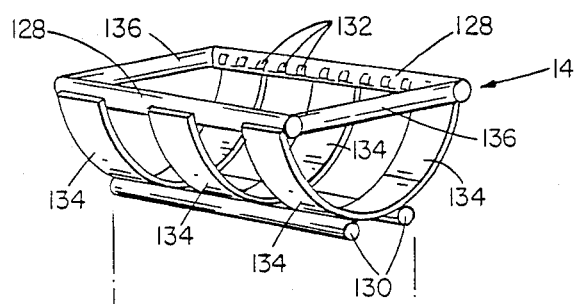
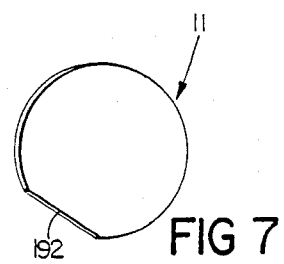
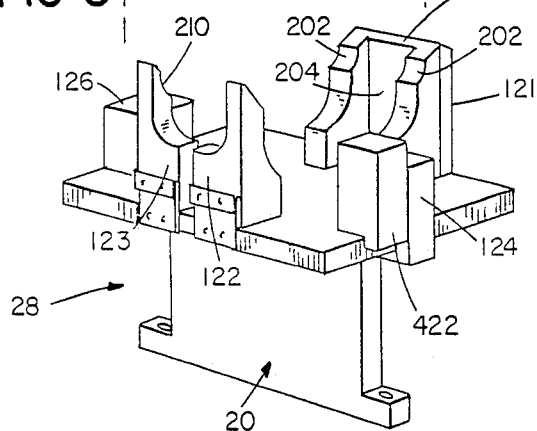
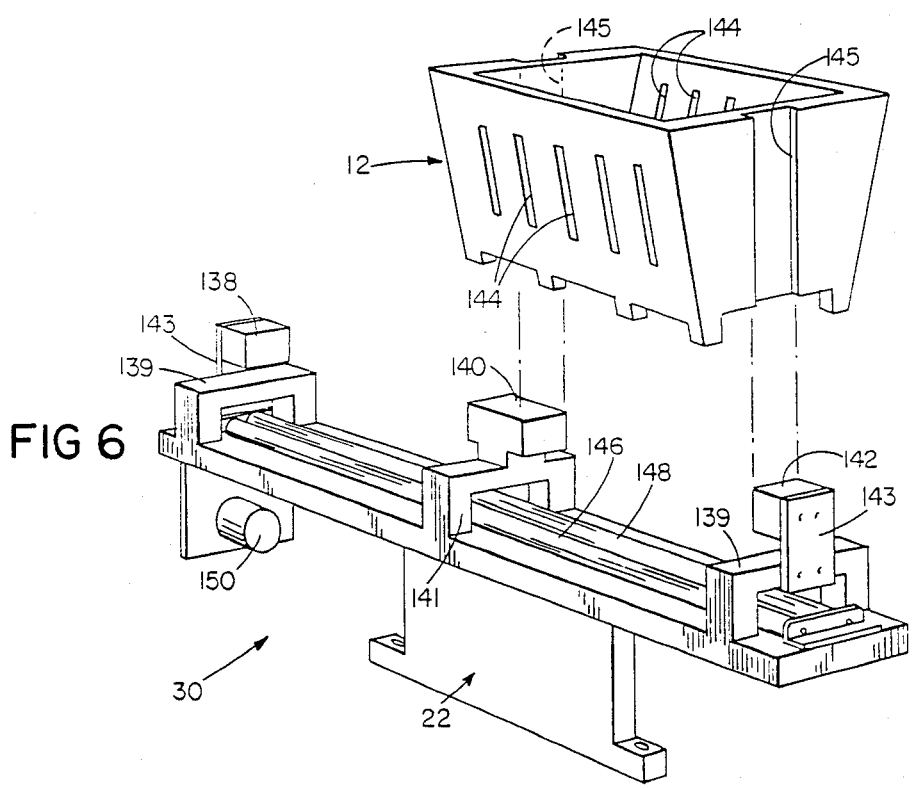

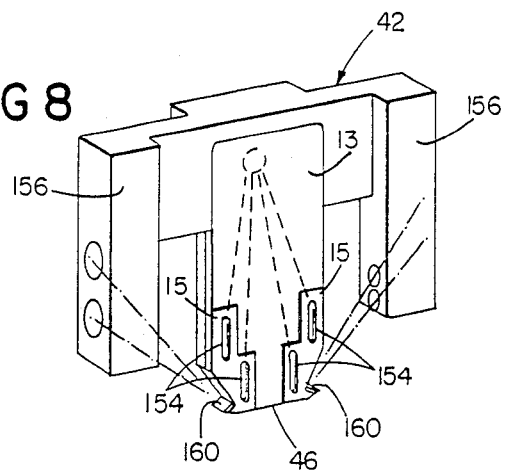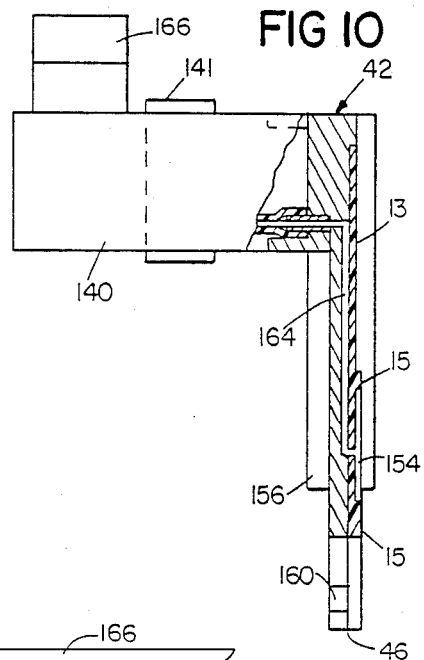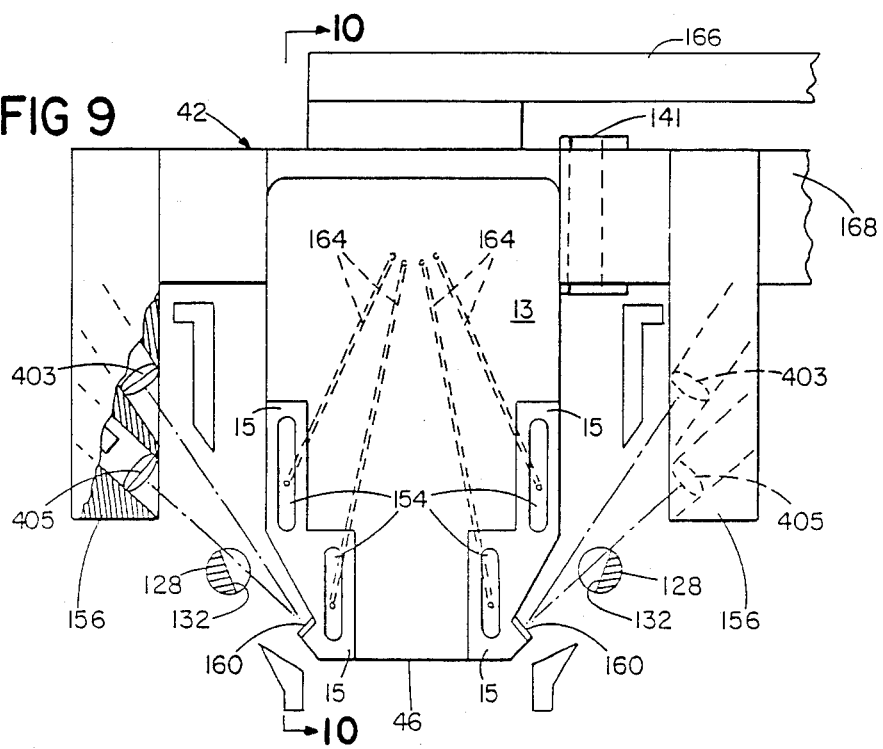

WAFER TRANSFER APPARATUS

BACKGROUND OF THE INVENTION

This invention relates to apparatus for automatic, precise placement of objects, e.g., placing semiconductor wafers in holders or boats.

It is desirable to rapidly transfer semiconductor wafers from plastic storage boats to quartz boats (in which they are introduced into a diffusion furnace), and vice versa, without introducing contamination onto the surfaces of the wafers. Such contamination often results during wafer placement in the quartz boats, from the wafers scraping against the slots into which they are placed. These slots are only slightly wider than the wafers themselves, and thus it has been difficult to achieve sufficiently precise placement as to avoid such scraping altogether. Contamination can also arise from scraping and sliding of parts within the apparatus being used to accomplish the transfer.

It is also desirable to be able to move arms and receptacles and the like (e.g., elements of a robot) to and from precise locations with good repeatability (i.e., such that they arrive back at the same location after being moved away temporarily). In apparatus for transferring semiconductor wafers, the wafer boats and the wafer transfer arm must both generally be moved about with precision.

SUMMARY OF THE INVENTION

In general, the invention features, in one aspect, providing on a support member (or "paddle") a sensor for sensing the alignment of the support member with some known location, recognizable by a known variation in shape (e.g., a slot), onto which an element (e.g., a semiconductor wafer) is placed by the support member. In preferred embodiments, sensing is done in advance of placement; sensing is accomplished by transmitting an energy beam (e.g., light) along a path intersecting with slots in a holder for semiconductor wafers and the output of the sensor is processed to determine the locations of the holder at which the wafer paddle is so aligned that wafers supported thereon would be received at the centers of the slots; these alignment locations are stored and used later on to align the holder when wafers are actually transferred; two sensors, one for slots in each of two rails in the holder, are provided on the wafer paddle; and mirrors on a central portion of the paddle reflect light travelling between sources and sensors located on outer portions of the paddle, only the central portion actually being received inside the boat.

In another aspect, the invention features picking up semiconductor wafers with vacuum openings positioned nearer the periphery than the center of the wafer so as to provide greater certainty as to the locations of the wafer edges with respect to the pickup element (despite warpage of the wafers. In preferred embodiments, the vacuum openings are surrounded by raised ridges so that the central region of the wafer paddle, inside of the openings, is lower than the openings so as to provide room for wafer warpage without the warped portions of the wafer touching the rest of the paddle; individual pressure sensors are provided for the vacuum openings so that initial contact of the paddle with a wafer can be sensed by the presence of a vacuum in just one opening; apparatus for moving the wafer paddle relative to the wafer is adapted to slow down after sensing closure of one opening.

In another aspect, the invention features a wafer paddle made by laminating Teflon to aluminum. In preferred embodiments, the aluminum is grooved and supplied with tubes for supplying vacuum to openings in the Teflon surface.

In another aspect, the invention features placing or picking up a wafer softly by using a damper to control the speed of final placement and intial pickup.

In another aspect, the invention features rotating individual wafers prior to insertion into a holder so as to better align them with slots in the holder. In preferred embodiments, sensors establish slots locations and the rotation angle is determined from the sensor outputs; a rotatable arm driven by a stepping motor and cam accomplish the rotation.

In another aspect, the invention features a trolley supported by sets of rollers on the top and bottom surfaces of a track, a flexure element pressing the rollers against the track surfaces. In preferred embodiments, such track/trolley apparatus is used to support and translate wafer holders with respect to a wafer paddle; a double set of such tracks and trolleys provides precise translation of the wafer paddle in a plane; a chain and sprocket driven by stepping motors and coupled with an encoder drive and measure the location of a trolley.

In another aspect, the invention features retaining a quartz boat for semiconductor wafers by gripping its two upper rails at three points by means of grooves into which the rails are received and by providing a non-grooved flat surface at a fourth point, to thereby accomodate boats with misaligned rails.

The various aspects of the invention have numerous advantages: Providing sensors on the wafer paddle itself eliminates the need for knowing the absolute locations of either the paddle or the wafer holder, and thus less precise manufacturing tolerances are required and variations with time and change of environment are automatically accomodated. Wafers are placed into holder slots without scraping the slot walls so as to avoid creating particulate contamination. The wafer holders and paddle arm are translated precisely to prescribed locations without generating contaminants from the transport mechanism. Soft placement and pickup of wafers further cuts down on contaminants by preventing break off of particles from the edges of the wafers. Warped wafers are accomodated by the features of the vacuum pickup, and warped boats are accomodated by the boat retention features.

Other features and advantages of the invention will be apparent from the following description of the preferred embodiment, and from the claims.

DESCRIPTION OF THE PREFERRED EMBODIMENT

The preferred embodiment of the invention will now be described.

Drawings

FIG. 1 is a perspective, somewhat diagrammatic view of said preferred embodiment.

FIG. 2 is a partially cutaway view of said embodiment with the cover removed.

FIG. 5 is a perspective view of a quartz boat and retention apparatus therefor.

FIG. 6 is a perspective view of a plastic boat, retention apparatus therefor, and a wafer alignment mechanism.

FIG. 7 shows a typical wafer.

FIG. 8 is a perspective view of a wafer handling paddle.

FIG. 9 is a sectional view of a wafer handling paddle showing suction openings and the optical location system.

FIG. 10 is a sectional view taken along 10—10 of FIG. 9.

FIG. 11 is a plan view, partially cutaway, of a quartz boat and a wafer handling paddle, and including, in diagrammatic form, the lenses, fiber optic bundles, source, and sensor of the optical slot sensing system.

FIG. 14 is a sectional view taken along 14—14 of FIG. 13.

FIG. 15 is a cross-sectional view of a plastic boat showing the wafer handling paddle and wafer alignment mechanism.

FIG. 16 is a diagrammatic view of the mechanism for effecting soft placement and pickup of wafers.

STRUCTURE

Figure 3:
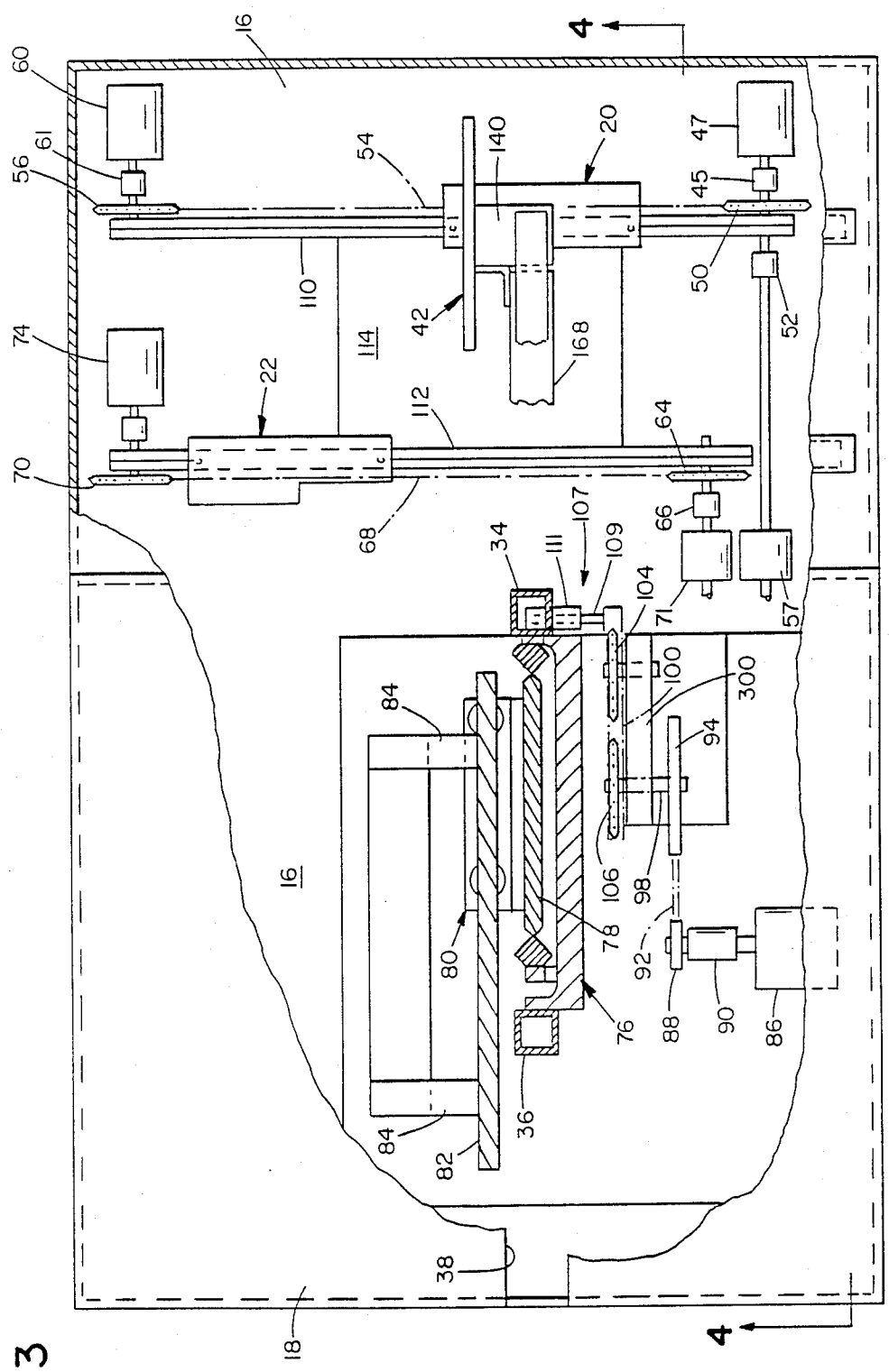
FIG. 3 is a plan view, partially cutaway, of said embodiment.

Referring to FIG. 1, there is shown wafer handling device 10, for transferring semiconductor wafers 11 to and from plastic boats 12 to quartz boats 14 (in which the wafers are held when put into a diffusion furnace).

Device 10 has base 16 (upon which cover 18 rests), trolleys 20, 22 for transporting the boats, and wafer transfer arm 32.

Trolleys 20, 22 extend through slots 24, 26 respectively, of cover 18. Lip 21 runs along both sides of the slots. Trolley 20 has affixed to its upper end platform 28, which supports quartz boat 14. Trolley 22 has affixed to its upper end platform 30 to support plastic boats 12.

Both trolleys 22, 22 include channel shaped member 116 which is bolted between the upper and lower portions of the trolley (shown in FIG. 14 for trolley 22). Drip shield 118, which is attached to cover 18, fits inside the channel shaped opening created by member 116. Channel shaped member 116 and corresponding drip shield 118, along with lips 21, prevent leakage of any residual washing fluid into cover 18.

Wafer transfer arm 32 is attached to vertical arms 34, 36 which extend through slot 38 in cover 18. A right angle member 40 connects arm 32 to aluminum wafer paddle 42, which has four suction openings 154 in the center leg 46 of the paddle, for gripping wafers. At each vacuum opening 154, there is a picture-frame-like raised ridge (0.010 elevation) surrounding the opening. The openings and ridges are located so as to grip wafers nearer their edges than their centers.

Referring to FIGS. 8 and 10 paddle 42 has Teflon sheet 13 laminated to one face of center leg 46. The Teflon sheet (which has been etched to aid bonding) is bonded to the aluminum with chemgrip epoxy adhesive (Chemplest Inc., Wayne, N.J.) and then machined to the desired thickness (about 0.020 inches). The overall thicness of center leg 46 is about 0.12 inches; this dimension is kept small to permit the paddle to be moved very close to either end of the boats so that wafers can be loaded into slots at the ends. Vacuum tubes 164 are inserted in grooves in the aluminum prior to application of the Teflon sheet. Vacuum fittings and lines (not shown) connect tubes 164 to a vacuum source. Four solenoid valves and four sensors (not shown), one each in each vacuum line, individually control and sense the vacuum at each opening 154.

An evacuated tank is connected to the main vacuum line and, with a main solenoid valve, is used to maintain vacuum at minimum of two openings 154 in the event of loss of the main source of vacuum. The pressure sensors in the vacuum lines provide information on which two openings have the best vacuum, and thus the best grip on a wafer. The valves for the other two openings are then shut to enable the evacuated tank to maintain vacuum only at the other two openings. The tank can maintain the vacuum long enough to allow the system to set down the wafer being held in one of the boats.

Figure 13:
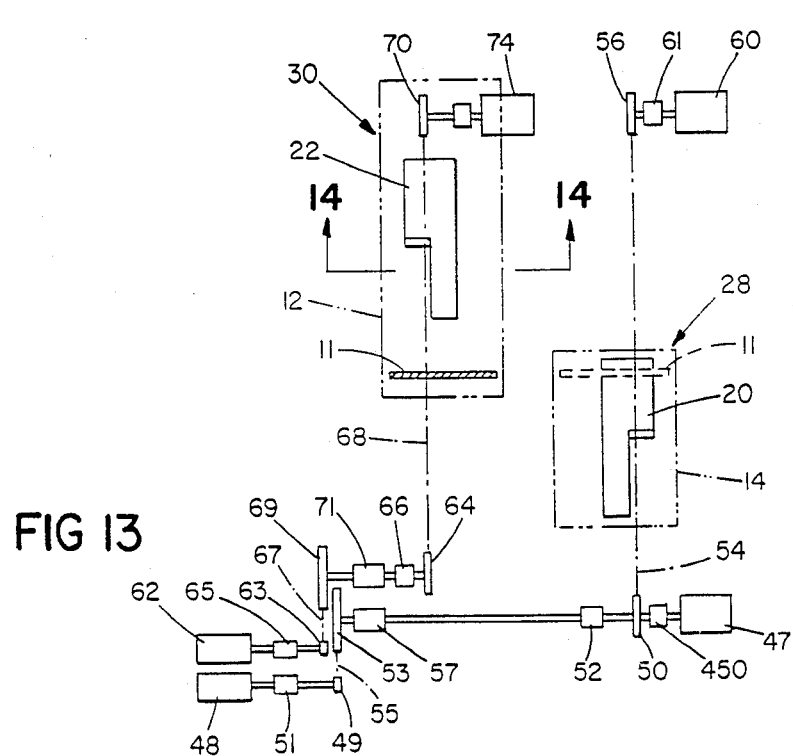
FIG. 13 is a somewhat diagrammatic plan view of the plastic and quartz boat trolley drive mechanisms.

Referring to FIG. 13, there is shown the drive mechanism for quartz-boat trolley 20. Servo motor 48 is attached to sprocket 49 by helical coupling 51. Chain 55 (typical of other chains described herein, is a cable chain belt made by Winfred M. Berg, Inc., which has no backlash and very little stretch) runs between sprocket 49 (which is supported by bearings in the same manner as the other sprockets) and sprocket 53. A fixed lower plate and an adjustable upper plate (not shown) support sprockets 49 and 53 and allow movement of the sprockets with regard to each other in order to provide for tension adjustment of chain 55. Sprocket 53 is coupled to sprocket 50 by clutch assembly 57 and helical coupling 52. Trolley 20 rests on aluminum track 110 (FIG. 2) and is affixed to chain 54, which runs between sprockets 50, 56. The support structure for sprockets 50, 56 is movable along the "Z" axis (FIG. 2) to allow for tension adjustment of chain 54. Trolley 20 is affixed to chain 54 by flexible fastening assembly 201 which is bolted to the trolley and to the chain. Incremental optical encoder 60 is connected to sprocket 56 by helical coupling 61. Redundant incremental optical encoder 47 may be provided (connected to sprocket 50 by helical coupling 45). Encoder 60 provides 0.0003 inch resolution along the Z direction for motion of trolley 20.

Also shown in FIG. 13 is the drive mechanism for the plastic-boat trolley 22. Servo motor 62 is attached to sprocket 63 by helical coupling 65. Chain 67 runs between sprocket 63 and sprocket 69. Tension in chain 67 is adjustable in the same manner as described for chain 55. Sprocket 69 is coupled to sprocket 64 by clutch assembly 71 and helical coupling 66. Trolley 22 rests on aluminum track 112 (FIGS. 2 and 14) and is affixed to chain 68 which runs between sprockets 64 and 70. The support structure for sprockets 64, 70 is movable along the "Z" axis to allow for tension adjustment of chain 68. Trolley 20 is affixed to chain 68 in the same manner as trolley 22 is affixed to chain 54. Incremental optical encoder 74 is connected to sprocket 70 by a helical coupling. Clutches 57 and 71 prevent the trolleys from breaking a wafer (by pressing it too hard against the paddle) during a malfunction. Even though clutch slippage shifts the relationship between the servomotors and the trolleys, it does not affect the relationship between encoders 60, 74 and the trolleys, and thus no information on trolley position is lost when clutch slippage occurs, because the encoders are coupled directly to the sprocket driving the trolleys.

Referring to FIGS. 2 and 3, there is shown the mechanism supporting wafer transfer arm 32. Vertical arms 34, 36 are affixed to trolley 76 which is attached to vertical aluminum track 78. To allow both x and y motion of arm 32, vertical track 78 is affixed to trolley 80 which is attached to horizontal aluminum track 82 that is rigidly attached to base 16 by support members 84.

Figure 4:
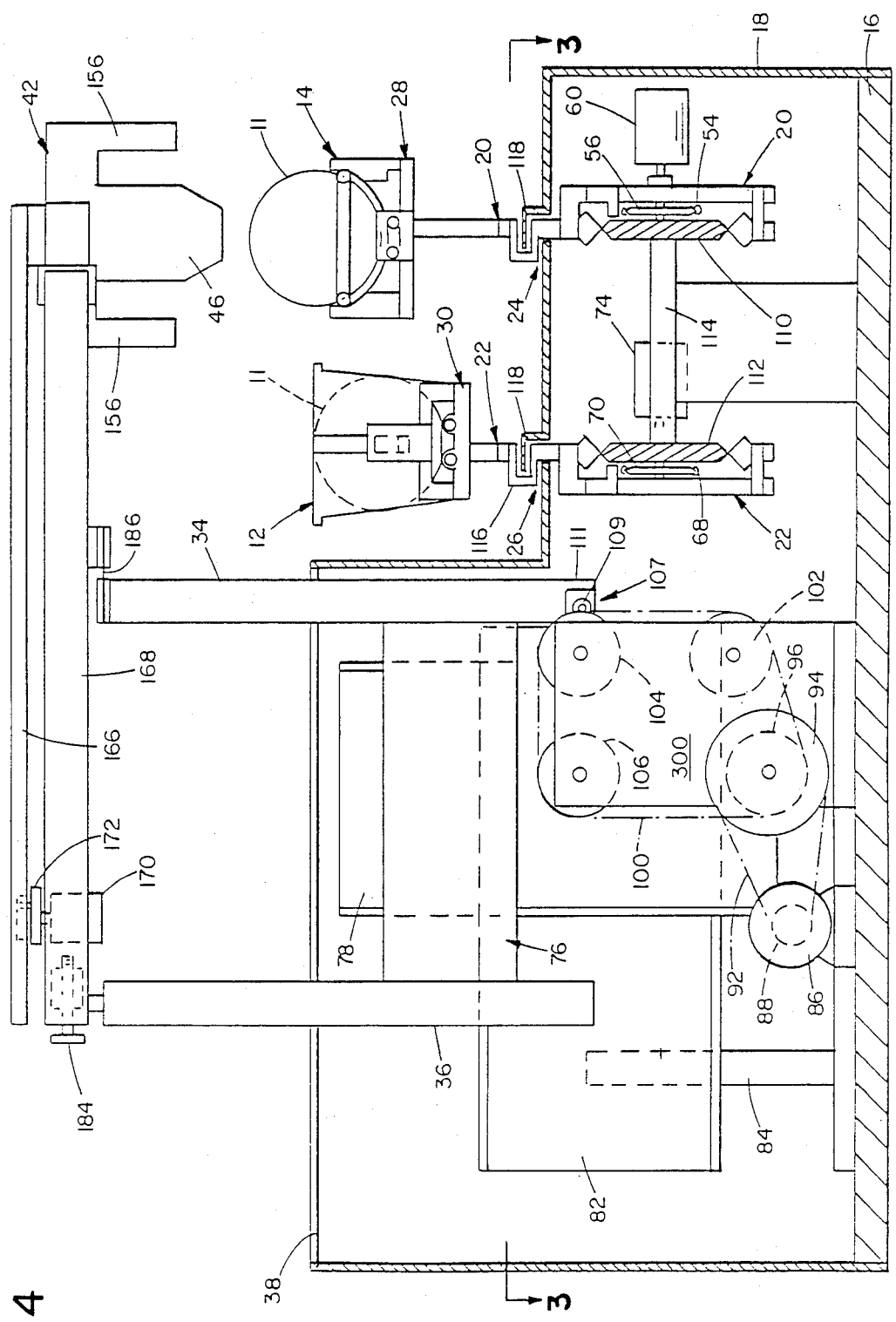
FIG. 4 is a sectional view taken along 4—4 of FIG. 3.

Shown in FIGS. 2, 3, and 4 is the drive mechanism for wafer transfer arm 32. Stepper motor 86 is coupled to sprocket 88 by clutch assembly 90. Chain 92 runs between sprockets 88 and 94. Sprocket 94 is connected to sprocket 96 by shaft 98 extending through vertical member 300. Chain 100, wrapped around sprockets 96, 102, 104, 106, is attached to vertical arm 34, by coupling 107, which enables movement of chain 100 to translate vertical arm 34. Coupling 107 includes pin 109, affixed to chain 100, which fits into a corresponding hole in block 111, which is affixed to arm 34. Vertical and horizontal motions of the paddle, in the "Y" and "X" directions respectively, are controlled by stepper motor 86 driving chain 100, which is connected to vertical arm 34 by coupling 107. Pin 109 is inserted into a corresponding hole in the block so that it can freely rotate when the motion of arm 34 changes from the "X" direction to "Y" direction or from the "Y" direction to the "X" direction. Carriage 76 rides on track 78 allowing vertical motion, while carriage 80 rides on track 82 allowing horizontal motion.

Referring to FIG. 4, aluminum tracks 110 and 112 are attached to support structure 114, which is rigidly affixed to base 16.

Referring to FIG. 5, teflon retaining members 120, 122, 124, 126, for retaining quartz boat 14, are affixed to platform 28. Member 126, located at one end of platform 28, is fixed while member 124, located at the other end of the platform is flexibly attached to the platform. Members 124, 126 engage opposite ends of one lower boat rail 130. Member 120, located along the back side of platform 28, has an aluminum back 121 to keep it rigid, while members 122, 123, on the opposite side, are flexibly attached to the platform by spring-steel flexures at their bases. Fixed member 120 has a groove 202, parallel to and able to engage an upper boat rail 128, and vertical cut-out 204 to accommodate center band 134 of the quartz boat. Flexible member 123 has a groove 210 parallel to and capable to engaging an upper boat rail on one side of the center band. Flexible member 122 has no groove for engaging an upper rail but instead a flat tapered surface; the absence of a groove helps accommodate angular misalignment between the two upper rails, by permitting the upper rail adjacent member 122 to assume any location along its ungrooved surface. This assures that the upper rails are snugly held in the grooves of the other retention member member. Were grooves to have been provided in all members, a boat with misaligned rails would not have been held in all grooves, and there would be no predictability as to which grooves it was held snugly in. With the disclosed three-point arrangement it is known that the rails will always be snug in the three grooves provided in members 120 and 122, and thus repeatable, precise positioning of the boat is possible.

Quartz boat 14, which mates with the retaining members, consists of two upper rails 128, and one or two lower rails 130. The upper rails contain slots 132, for receiving wafers. The rails are attached together by three semi-circular bands 134 and two end pieces 136, such that the rails are parallel with respect to each other. Wafers rest in the slots and on top of the bottom rails. Misalignment between the two slotted, upper rails is common, resulting either from errors during the boat's manufacture or from warping of the boat in the diffusion furnaces. The misalignment can be angular or simply a relative shift along the Z direction, but the usual result is that a wafer must be rotated about the Y axis in order for it to be inserted into a pair of slots without scraping the slot walls.

Referring to FIG. 6, there are shown the retention members for plastic boats 12. Aluminum channel sections 139, located at either end of platform 30, support flexible retaining members 138, 142 which are teflon and attached by a spring-steel plate 143 to the channel sections 139. Aluminum channel section 141, located at the center of platform 30, supports fixed teflon retaining member 140, which is located between the two boats 12. Retaining members 138, 140, 142 slide into grooves 145 located at both ends of the boats. The flexibility of members 138, 142 securely holds the boats in place, while the rigidity of member 140 maintains precise positioning of the boats with respect to the platform. The plastic boats 12 have open bottoms and side slots 144 for receiving wafers.

Alignment rollers 146, 148 extend longitudinally along the top of platform 30 and can contact wafers through the open bottoms of the boats. As shown in FIG. 15, roller 146 is coupled to motor 150 by chain 152.

Referring to FIGS. 8 and 11, wafer paddle 42 has center leg 46 and two outer, optical legs 156. Light from pulsed infrared LED source 400 (about 10,000 pulses per second, each pulse only about 10 microseconds duration, manufactured by Texas Instruments under designation TIL31) passes through lens 401, fiberoptic bundle 402 (which extends through the hollow of arm member 168 to the paddle), and lens 403 at the paddle. Light reflected by mirror 160 and received at lens 405 travels back through another fiberoptic bundle (not shown), through another lens (not shown), to an infrared sensor (manufactured by Texas Instruments under designation TI81; not shown). Identical arrangements of source, lenses, fiberoptic bundles, and sensor are used for both sides of the paddle. The lenses at the source and sensor ends of the fiberoptic bundles are chosen to focus light from the sources into the bundles and from the bundles onto the sensors. The lenses on the paddles are chosen to assure that the light beam is focused at approximately the slot location so as to minimize the beam width at that location and thereby increase the system's ability to discriminate the center of a slot.

Mirror 60 is trapezoidal in cross section. The narrow base of the trapezoid does the light reflecting and is only about 0.030 inches wide so as to reflect only a light beam of the same width. The adjoining tapered surfaces of the mirror (corresponding to the slanting legs of the trapezoidal cross section) reflect away other light.

The light beam is focused at the location of slot interception, so as to be narrowest at that location, and thereby improve the ability to discriminate the slot center. The beam width is on the order of the slot width at such location, and no wider than 150% of the slot width.

To avoid having to continuously flex the fiberoptic bundles as the paddle arm is moved about in the XY plane, the ends of the fiberoptic bundles are moved with the arm and only come into alignment with the sources and sensors when the paddle is lowered into its measurement position in the quartz boat; at other paddle positions, when no light measurements need to be made anyway, the bundles are displaced from the sources and sensors.

Figure 12A:
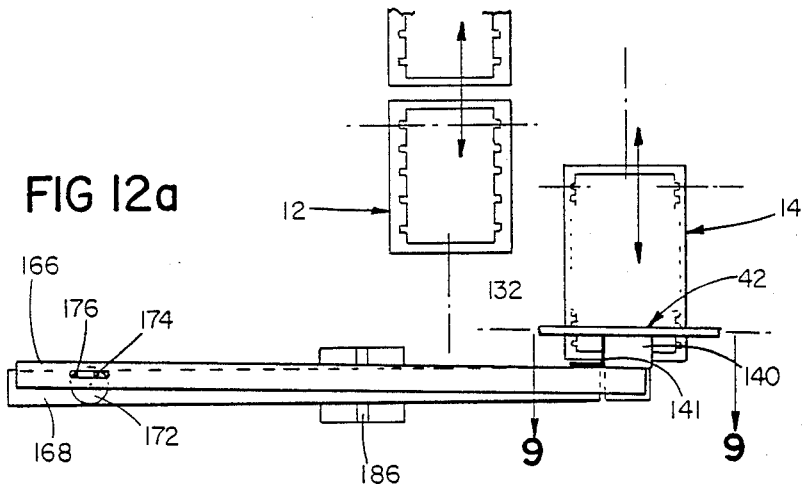
FIGS. 12a and 12b are plan views of the wafer handling paddle and arm, showing the arm in two different angular positions (FIG. 12b is a partial view of one end of the arm).
Figure 12B:
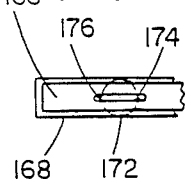

Referring to FIGS. 2, 4, and 12, there is shown the mechanism for rotating arm 32 about the y axis in order to so rotate the wafers. Wafer transfer arm 32 consists of solid member 166 and hollow member 168. Motor 170 is connected to cam 172, which has pin 174 (FIG. 12) extending into slot 176 in member 166. Member 166 is rigidly attached to member 140 which supports paddle 42. Members 140 and 168 are attached by spring-steel flexure 141, which permits y-axis rotation between member 166 and paddle 42.

Shown in FIG. 16 is the mechanism for effecting soft placement and soft pickup of wafers from the quartz boat, so as to avoid contamination from pieces of the wafer breaking away from the wafter's edge when a wafer is placed down (or picked up) hard. Vacuum-operated actuator 410 and spring 412 are affixed to one end of pivoting arm 414. Frictionless damper 416 is affixed to the far end of member 168 of the wafer transfer arm. Rod 418 connecting damper 416 and member 168 slides freely through pivoting arm 414 until enlarged portion 420 contacts the pivoting arm.

Soft placement is achieved by first activating actuator 410 to pull arm 414 downward, thus lifting the wafer transfer paddle slightly, and then, when the paddle is in position for soft placement, releasing actuator 410, which under the force of spring 412 quickly moves arm 414 upward, to allow paddle downward motion to be resisted solely by the force of damper 416.

Soft pickup is achieved simply by activating the vacuum actuator. Damper 416 resists downward movement of the actuator, and thus a slow pickup of the paddle is provided. Vertical movement of the paddle during soft placement and pickup is on the order of 100 to 200 mils, and the time interval for such movement is on the order of $\frac{1}{2}$ second. Adjustable counterweight 184 on the far end of arm member 168 is adjusted to give the paddle (loaded with a wafer) a downward impact force of about 50 grams. A manual-adjustable, variable-flow valve in the vacuum line is used to adjust the speed of descent and ascent.

Referring to FIG. 14, aluminum track 112, which is typical of tracks 78, 82, 110, has inclined surfaces 188 running longitudinally along its top and bottom. Trolley 20, in a manner typical of trolleys 22, 76, 80, is supported on track 112 by roller bars 189, each of which has a pair of aluminum rollers 190 resting on surfaces 188 which are inclined at a 45 degree angle. Each roller 190 rotates on a stationary shaft which is pressed into a roller bar and held by a set screw. A spacer on the shaft prevents contact between roller 190 and roller bar 189, while a snap ring holds the roller on the shaft. The rollers are pressed against surfaces 188 of the tracks by action of parallel spring steel flexures 185, 187, which connect the carrier to one of the roller bars. Parallel string steel flexures 185, 187 provided on trolleys 20, 22, 76, 80 work as a parallelogram to soak up variations without slop or backlash and to keep the trolleys from tilting, thereby supporting the trolleys on the tracks without any lost motion therebetween. Bottom surfaces 188 need not be machined as precisely as bottom surfaces 188, as the flexures will soak up variations in the bottom surfaces. Adjustment mechanisms (not shown) are provided on boat trolleys 20, 22 to permit vertical adjustment and tilt adjustment (about X and Z axes) between the boat retention members and the trolley.

Operation

Two plastic boats 12, filled with wafers 11, are washed and then placed onto platform 30, of trolley 22, and are held in place by retaining members 138, 140, 142.

Stepper motor 150, coupled to roller 146 below the plastic boats 12, is activated for a short interval, to rotate roller 146, which, in turn, rotates wafers 11, until the flat sides 192 of the wafers are all facing downward (i.e., parallel to platform 30). Roller 148 moves freely and assists in guiding the wafers into the desired position. Roller 146 ceases to cause wafer rotation once a wafer's flat side is facing downward. The time interval during which stepper motor 150 is activated is made sufficiently long to assure that all wafers reach the desired position.

An empty quartz boat 14 is placed onto platform 28, and retained there by members 120, 122, 124, 126. The paddle is lowered into the boat, and trolley 20 is moved to move the paddle past the slots. The height of the paddle is adjusted until the light path is at such a height that there consistently occurs variation in the light sensor output at slot locations. This adjustment need not be repeated for each transfer, as the quartz boat retention members assure that the quartz rails and the slots therein are always at the same height.

To measure the locations of slots 132 in the upper rails of the empty quartz boat 14, wafer paddle 42 is moved into one end of the interior of the empty quartz boat. Center leg 46 of the paddle passes between upper rails 128, while optical legs 156 pass along the outside of the boat. Quartz-boat trolley 20 is then advanced so as to move (at a speed of about 1 in/sec) the paddle past a group of five slots 132 near the end of the boat closest to retention member 123 (the one with groove 210). Measurements are made at that end because only there is it assured that both boat rails are at a known vertical position (at the other end, one of the rails could be too high or too low due to rail misalignment for the slot sensors to work properly).

The locations of slots 132 are determined by sensing the variation in light intensity at the light sensors. Light travelling from the sources is reflected by mirrors 160 back to the sensors. That light path is blocked except when a slot 132 is encountered, as shown in FIG. 9. Maximum light transmission occurs at the precise center of each slot. Locations of alignment between the paddle and the ten slots (five on each rail) are determined from the outputs of encoder 60 and the light sensors. The ten locations are then processed to determine what wafer rotation angle theta (FIG. 11) is required to cause wafers carried by the paddle to be aligned with the slots. One wafer rotation angle is generally good for all pairs of slots (because variations in slot spacing between the two upper rails is very much less than the variation in longitudinal position of the rails). But different wafer rotations for each slot pair can also be provided if necessary.

Once the wafer misalignment angle theta has been determined, paddle 42 is rotated about the Y axis by precisely that angle. This is accomplished by activating stepper motor 170, which rotates cam 172 causing pin 174 (FIGS. 12a and 12b) to translate longitudinally in slot 176 in member 166 of arm 32. This causes member 166, which is rigidly affixed to paddle 42, but flexibly attached to member 168 via spring-steel flexure 141, to rotate about the Y axis in relation to member 168.

To check the accuracy of the angular correction, paddle 42 is moved in a second pass through quartz boat 14. Again the output of encoder 60 is stored, and alignment locations are determined from points of maximum light. If the new set of locations show adequate alignment, wafer transfer is begun. If alignment is inadequate, a new wafer rotation angle theta is determined, and stepper motor 170 is activated to position paddle 42 at the new angle, and another pass is made through the quartz boat. This procedure is generally repeated several times until proper alignment is achieved. (If proper alignment remains unachieved, an error indication is provided to the operator.) As a final check on alignment, a pass is made across substantially all the slots in the boat (1 or 2 slots on each end may not be observable by the optics, but can be filled with wafers by calculating what their locations on the basis of the other slot locations), and the outputs of encoder 60 and the light sensors are used to determine whether for each pair of slots a wafer will be received close enough to the center of the slot as to avoid scraping between the wafer edge and the slot walls. All slots on the back rail must be sensed and their centers must be positioned consistently with scrape-free placement. Not all slots on the front rail can always be sensed, however, because rail angular misalgnment can sometimes cause slots on the front rail to be too high or too low for the sensor to detect. Thus, not all front-rail slots need be sensed for the apparatus to decide to go ahead with transfer.

Wafer transfer begins with paddle 42 being moved into the first of the two plastic boats between one end of the first boat and the first wafer. That paddle location is the same for every transfer. The external vacuum source providing suction at openings 154 is activated, and trolley 22 is advanced until it is sensed by pressure sensors (not shown) that one of the four vacuum openings has been fully or partially closed by contact between the first wafer and the raised ridge 15 surrounding that first opening. The speed of trolley 22 is then immediately slowed to a reduced speed until at least the two upper openings and one of the lower opening are closed, at which time the trolley comes to a full stop. Such a three-point wafer pickup assures that no bending stresses are applied to the wafer (as might be the case were all four openings allowed to apply force to the wafer). Paddle 42, with the first wafer held to it by the suction provided at openings 154, is then raised, translated over the quartz boat which has been located by trolley 20 in the precise position for receiving the first wafer, and lowered into the quartz boat.

To provide a soft final placement of the wafer in the quartz boat, the soft placement mechanism of FIG. 16 is activated and the final descent of the paddle is controlled by the damper. The vacuum source for suction of vacuum openings 154 is then turned off, the quartz boat is translated slightly to move the wafer away from the paddle, and the paddle is raised from the quartz boat and returned to the plastic boat.

The same wafer transfer procedure is repeated until all wafers have been transferred to the quartz boat.

Transfer from the quartz boat to the plastic boat is accomplished in the reverse manner, using soft pickup instead of soft placement.

Sensors are provided for sensing (1) whether one or two plastic boats are on trolley 22, (2) whether quartz boat has wafers (infrared source/sensor in sensor block 422 with optical path along Z direction through boat (FIG. 5)), (3) whether either plastic boat has wafers (another infrared source/sensor like that for quartz boat), (4) whether quartz boat has been installed (another infrared source/sensor in block 420 looking along Z axis and interrupted by quartz of boat).

Slots in the quartz boat are about 0.030 inch wide, and the wafers are about 0.025 inch wide. By precisely aligning each wafer edge with the center of its corresponding slot, the apparatus avoids scraping the wafers against the slots during insertion, thereby avoiding generation of contaminants from such scraping (particles flying off the wafer and boat as the result of scraping can become fused on the wafers).

To assure that all wafers uniformly tilt in one direction (about the X axis) after insertion in the slots, the whole apparatus may be tilted about the X axis by about 15 degrees using adjustable-height legs (not shown).

The arrangement of vacuum openings on the paddle has the advantage of being able to support even badly warped wafers (e.g., 1 mil for every inch of wafer diameter). By providing a raised edge around the vacuum openings, the wafer is supported off of the surface of the paddle, thereby providing room for warpage without the wafer touching the rest of the paddle. By locating the vacuum openings near the periphery of the wafer, the effects of warpage on the location of the wafer edges is lessened, because in the small distance between the vacuum openings (where the wafer is held at a known location with respect to the paddle) and the wafer edge, the warpage cannot possibly cause very much displacement of the edge. This is to be contrasted to holding the wafer at its center, wherein much greater variation in the locations of the wafer edge could result (and thus make placement of the wafer edges in boat slots all the more difficult). Five inch (or 125 mm) wafers are especially subject to bad warpage, but the apparatus disclosed is fully able to accomodate such wafers.

Prior to either slot measurement or wafer transfer, the apparatus is put through a calibration sequence (initiated simply by turning the power off and then on). This sequence, which just as all operations is under the control of a computer, checks that proper power and vacuum has been provided, and cycles the various stepping motors. The stepping motors driving the two trolleys are driven to one limit, and the counters for each motor are set to zero to provide an absolute counter reference for the motors. The wafer theta stepping motor is also cycled to both its extreme limits, and then to its center position. The wafer-arm stepping motor (for moving the arm in the XY plane) also goes to its normal reset position, which is up and to the rear.

Buttons (not shown) are provided on the front panel for starting/stopping the apparatus and for starting/stopping wafer transfer. The latter is used to stop transfer in an emergency.

Pressing the start-transfer button causes the apparatus to check sensor outputs to determine how many plastic boats have been loaded (one or two) and whether a quartz boat is present. Also checked is whether wafers are present in the quartz or in the plastic boats. That information tells the apparatus in which direction the wafers are to be transferred. Should wafers be detected in both locations, an error indication is provided (such as by displaying a numerical error code on the front panel).

In a plastic to quartz boat transfer, the quartz-boat trolley is centered and the paddle is brought down to the predetermined height for slot sensing. Then the quartz boat translates to bring the paddle/sensor to one end of the boat, where the iterative procedure of determining a paddle rotation angle theta is performed: (1) the paddle/slot alignment locations of five pairs of slots are measured, (2) the paddle is rotated to correct for misalignment, (3) slot/paddle alignment is checked with the rotated paddle, and (4) the procedure is repeated until the best rotation angle for alignment is obtained.

OTHER EMBODIMENTS

Other embodiments are within the following claims. E.g., the apparatus is easily modified to work with different size wafers and different configuration boats; additional sensors could be added to the paddle to sense the locations of slots in the bottom rails of the quartz boats; different types of surfaces could be provided for the trolley tracks, e.g., surfaces 188 could be replaced by a plastic bar affixed to the top and bottom of the respective track to provide quieter operation and reduced wear; and a sensor could be added to sense whether a boat has been installed backward by sensing whether the front or back of the wafer is being observed.

What is claimed is:

1. Apparatus for placing a first element in a precise receptacle location on a second element, there being associated with said precise receptacle location some known variation in the shape of said second element, said apparatus comprising a support member for supporting said first element while said member is translated toward said second element along a placement direction, first transport means for moving said support member or said second element along a direction transverse to said placement direction, and sensing means located on said support member for sensing the relative alignment along said transverse direction of said support member and said variation in shape, said sensing means comprising an energy-beam source adapted and positioned to direct an energy beam along a path that interacts with said variation in shape at least when said support member and receptacle location are aligned so that more of said beam is transmitted along said path when said member and receptacle location are aligned than when said member and receptacle are not aligned and an energy beam sensor adapted and positioned to detect the difference in the amount of said beam transmitted along said path.

2. The apparatus of claim 1 further comprising second transport means for moving said support member and sensing means with respect to said second element along said placement direction.

3. The apparatus of claim 1 wherein said variation in shape comprises said receptacle location, there are a plurality of said variations in shape on said second element, and said first transport means is adapted to move said support member or said second element so as to cause said sensing means to successively move past each of said plurality of variations in shape.

4. The apparatus of claim 3 further comprising first processing means for storing information on the relative alignment of said support member and variations in shape as said first transport means moves said sensing means past said variations and second processing means for processing said stored alignment information and determining therefrom the positions required of said first transport means in order for said support member when moving along said placement direction to place a said first element at each of said plurality of variations of shape.

5. The apparatus of claim 1 wherein said first element is a semiconductor wafer, said support means is adapted to support said wafer, and said variation in shape comprises a receptacle for said wafer.

6. The apparatus of claim 5 wherein said second element is a holder for a plurality of said wafers, said receptacles comprise wafer-supporting slots, said slots are spaced along said transverse direction, and said apparatus further comprises second transport means for moving said support member and sensing means with respect to said holder along said placement direction.

7. The apparatus of claim 6 further comprising means for successively moving said support member back and forth along said placement direction to place said wafers one at a time in said pairs of slots.

8. The apparatus of claim 6 further comprising position measuring means for measuring the position along said transverse direction of whichever of said holder or support member is moved by said first transport means, measurement control means for activating said first transport means to move said support member and sensing means past said plurality of slots, first processing means for processing the outputs of said position measuring means and said sensing means to determine a plurality of alignment locations along said transverse direction at which said support member and slots are so aligned that wafers moved along said placement direction by said support member would be received by said slots.

9. The apparatus of claim 8 further comprising wafer loading control means for activating said first transport means to move said support member or holder successively to each of said alignment locations and for activating said second transport means at each of said locations to move a said wafer carried by said support member into a said slot.

10. The apparatus of claim 9 wherein there are two said slots in said holder for each said wafer and wherein said apparatus further comprises second processing means for processing the alignment locations of each slot of a pair to determine therefrom a rotation angle about an axis generally parallel to said placement direction by which a wafer must be rotated in order to be received by said paired slots when travelling along said placement direction.

11. The apparatus of claim 10 further comprising means for rotating said support member about said rotation axis by said rotation angle prior to placement of said wafers in said slots.

12. The apparatus of claim 11 wherein said measurement control means comprises means for moving said support member and sensing means past said plurality of slots a second time after said support member has been rotated about said rotation angle and said second processing means includes means for determining whether a change in said rotation angle could be made to improve the alignment of said support member with respect to said slots.

13. The apparatus of claim 11 wherein said measurement control means comprises means for moving said support member and sensing means past only a subset of said plurality of slots and said second processing means comprises means for determining said rotation angle for all said slots from the outputs for only said subset.

14. The apparatus of claim 9 wherein said wafer holder is a quartz holder suitable for placing said wafers in a furnace and said support member, sensing means, first and second transport means are so adapted to function with said quartz holder.

15. Apparatus for placing a semiconductor wafer in a precise slot location on a second element, there being at said precise slot location a known variation in the shape of said second element, said apparatus comprising
a support member for supporting said semiconductor wafer while said member is translated toward said second element along a placement direction,
a first transport means for moving said support member or said second element along a direction transverse to said placement direction, and
sensing means located on said support member for sensing the relative alignment along said transverse direction of said support member and said variation in shape,
said sensing means comprising
an energy-beam source adapted and positioned to direct an energy beam along a path that intersects said slot at least when said support member and slot are aligned so that more of said beam is transmitted along said path when said member and slot are aligned than when said member and slot are not aligned, and
an energy-beam sensor adapted and positioned to detect the difference in the amount of said beam transmitted along said path.

16. The apparatus of claim 15 wherein said energy-beam source comprises a light source for directing a light beam along said path and said energy-beam sensor comprises a light sensor.

17. The apparatus of claim 15 wherein said second element is a holder for a plurality of said wafers, there are two said slots in said holder for each said wafer, and there are two said sources and two said sensors located on said support member, each one directing a beam that intersects one of said slots in said pair upon alignment.

18. The apparatus of claim 17 wherein said light source and sensor comprise two fiber optic pathways extending to said support member and a light source and light sensor located remotely from said member.

19. The apparatus of claim 17 wherein said light beam at the region where it intersects said slot has a width no greater than 1.5 times the width of said slot, width being measured along said transverse direction, so as to increase the ability of said sensing means to resolve the location of said slot.

20. The apparatus of claim 17 further comprising
position measuring means for measuring the position along said transverse direction of whichever of said holder or support member is moved by said first transport means,
measurement control means for activating said first transport means to move said support member and sensing means past said plurality of pairs of slots,
first processing means for processing the outputs of said position measuring means and the outputs of both sensors of said sensing means to determine locations along said transverse direction at which said energy beams and slots are aligned.

21. The apparatus of claim 20 wherein said first processing means includes means for determining said locations of alignment by determining the locations along said transverse direction at which there is maximum transmission of said beams through said slots.

22. The apparatus of claim 17 wherein said support member comprises a central portion adapted to be received inside of said holder and at least one outer portion adapted to be positioned at the same general position along said transverse direction but on the outside of said holder, said central and outer portions straddling one side of said holder, and wherein said sensing means includes means for directing said light path from said central portion to said outer portion.

23. The apparatus of claim 22 wherein said source and sensor are located on said outer portion and a mirror for reflecting light travelling from said source to said sensor is located on said central portion.

24. The apparatus of claim 23 wherein there are two said mirrors on opposing sides of said central portion and two pairs of light source and sensor on two said outer portions, each of which straddle a side of said holder.

25. Apparatus for inserting semiconductor wafers in a holding boat of the type having at least two slots in which each said wafer is received, comprising
a wafer support member or paddle for supporting said wafers,
rotation means for rotating said support member by the angle necessary to cause edges of said wafers to be received at the centers of said slots,
placement means for translating said rotated support member so as to place said wafers in said slots in said holding boat,
sensing means for sensing the locations of said slots relative to the edges of said wafers to be received therein, and
processing means for determining said rotation angle from said locations,
whereby said wafers are placed in said slots without their edges scraping the walls of the slots.

26. The apparatus of claim 25 wherein said wafer support member is supported on an arm which is flexibly supported for rotation and wafer rotation is provided by rotation of said arm.

27. The apparatus of claim 26 further comprising a stepping motor and cam for rotating said arm, said stepping motor being controlled by the output of said processing means.

28. The apparatus of claim 27 wherein said sensing means is located on said support member and further comprising means for iteratively activating said stepping motor to rotate said support member by a said rotation angle, then activating said sensing means to determine if the chosen rotation angle provides the desired alignment of wafer edges and slot centers, and then again activating said stepping motor to change said rotation angle.

29. The apparatus of claim 27 further comprising a stationary arm relative to which said rotating arm is flexibly attached.

30. The apparatus of claim 29 wherein said stepping motor is fixed to said stationary arm and said cam comprises a rotatable member connected to said stepping motor shaft, said member having a pin offset from said shaft axis, and a slot in said rotatable arm for receiving said pin, whereby rotation of said stepping motor translates said pin within said slot and effects rotation of said rotatable arm.

31. The apparatus of claim 29 wherein said arms are adapted to be translated in unison without change to said rotation angle in order to transfer wafers to said boat.

32. Apparatus for placing a first flat element in a precise receptacle location on a second element, there being at said precise receptacle location some known variation in the shape of said second element, said apparatus comprising a support member for supporting said first element while said member is translated toward said second element along a placement direction, first transport means for moving said support member or said second element along a direction transverse to said placement direction, and sensing means located on said support member for sensing the relative alignment along said transverse direction of said support member and said variation in shape, said sensing means comprising an energy-beam source adapted and positioned to direct an energy beam along a path that interacts with said variation in shape at said receptacle location at least when said support member and receptacle location are aligned so that more of said beam is transmitted along said path when said member and receptacle location are aligned than when said member and receptacle are not aligned and an energy beam sensor adapted and positioned to detect the difference in the amount of said beam transmitted along said path.

* * * * *